US011889703B2

(12) United States Patent
Kim et al.

(10) Patent No.: US 11,889,703 B2
(45) Date of Patent: Jan. 30, 2024

(54) MAGNETIC JUNCTION MEMORY DEVICE AND READING METHOD THEREOF

(71) Applicant: Samsung Electronics Co., Ltd., Suwon-si (KR)

(72) Inventors: Chan Kyung Kim, Hwaseong-si (KR); Eun Ji Lee, Seongnam-si (KR); Ji Yean Kim, Hwaseong-si (KR); Tae Seong Kim, Yongin-si (KR); Jae Wook Joo, Daejeon (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 17/975,242

(22) Filed: Oct. 27, 2022

(65) Prior Publication Data
US 2023/0051494 A1 Feb. 16, 2023

Related U.S. Application Data

(63) Continuation of application No. 16/798,615, filed on Feb. 24, 2020, now Pat. No. 11,515,357.

(30) Foreign Application Priority Data

Jul. 18, 2019 (KR) .................. 10-2019-0086740

(51) Int. Cl.
*H10B 61/00* (2023.01)
*G11C 11/16* (2006.01)
*H10N 50/10* (2023.01)

(52) U.S. Cl.
CPC .......... *H10B 61/20* (2023.02); *G11C 11/1659* (2013.01); *G11C 11/1673* (2013.01); *H10N 50/10* (2023.02)

(58) Field of Classification Search
CPC .... H10B 61/20; H10N 50/10; G11C 11/1659; G11C 11/1673
(Continued)

(56) References Cited

U.S. PATENT DOCUMENTS 5,760,571 A * 6/1998 Latham .................. G05F 1/613
323/280
7,616,476 B2 11/2009 Hidaka
(Continued)

FOREIGN PATENT DOCUMENTS

KR 101224259 B1 1/2013

OTHER PUBLICATIONS

Office Action dated Mar. 2, 2022 for corresponding U.S. Appl. No. 16/798,615.

*Primary Examiner* — Jami Valentine Miller
(74) *Attorney, Agent, or Firm* — Harness, Dickey & Pierce, P.L.C.

(57) ABSTRACT

A magnetic junction memory device is provided. The magnetic junction memory device including a sensing circuit including a sensing node, the sensing node being connected to a first end of a transistor and configured to change a voltage of the sensing node in accordance with a resistance of a magnetic junction memory cell, a gating voltage generator circuit configured to generate a gating voltage of the transistor using a reference resistor and a reference voltage, and a read circuit configured to read data from the magnetic junction memory cell using the reference voltage and the voltage of the sensing node.

20 Claims, 14 Drawing Sheets

(58) Field of Classification Search
USPC .......................................................... 257/421
See application file for complete search history.

(56) References Cited

U.S. PATENT DOCUMENTS

| | | |
|---|---|---|
| 7,663,910 B2 | 2/2010 | Kang et al. |
| 7,843,716 B2 | 11/2010 | Kang et al. |
| 8,031,508 B2 | 10/2011 | Toda et al. |
| 8,315,090 B2 | 11/2012 | Ong |
| 8,385,106 B2 | 2/2013 | Ong |
| 8,587,994 B2 | 11/2013 | Kim et al. |
| 9,183,910 B2 | 11/2015 | Lee et al. |
| 9,202,543 B2 | 12/2015 | Boujamaa et al. |
| 9,343,131 B1 | 5/2016 | DeBrosse |
| 9,384,828 B2 | 7/2016 | Oh |
| 9,799,385 B2 | 10/2017 | Fujita |
| 2002/0089024 A1 | 7/2002 | Iwata |
| 2009/0207642 A1 | 8/2009 | Shimano et al. |
| 2013/0076390 A1 | 3/2013 | Kim et al. |
| 2015/0221365 A1 | 8/2015 | Park |
| 2016/0003923 A1* | 1/2016 | Zieren .................... H10N 59/00 324/252 |
| 2016/0093350 A1 | 3/2016 | Jung et al. |
| 2017/0272258 A1* | 9/2017 | Tanamoto ........... G11C 11/1675 |
| 2017/0345496 A1 | 11/2017 | Liu et al. |
| 2020/0160901 A1* | 5/2020 | Boujamaa ........... H03F 3/45269 |
| 2020/0312396 A1 | 10/2020 | Pyo et al. |
| 2021/0027823 A1 | 1/2021 | Kim et al. |
| 2021/0090631 A1 | 3/2021 | Gupta et al. |
| 2021/0193204 A1 | 6/2021 | Jaiswal et al. |

* cited by examiner

FIG. 6

| | | | | | |
|---|---|---|---|---|---|
| RC1 | | SMCA1 | | SMCA2 | RC2 |
| | | | | | |
| | | BLM1 | | BLM2 | |
| CMF1 | SA1 | WD1 | CDEC1 | CMF2 | SA2 | WD2 | CDEC2 |

MAGNETIC JUNCTION MEMORY DEVICE AND READING METHOD THEREOF

The present application is a continuation of and claims priority under 35 U.S.C. § 120 to U.S. patent application Ser. No. 16/798,615, filed on Feb. 24, 2020, which hereby claims priority under Korean Patent Application No. 10-2019-0086740, filed on Jul. 18, 2019, and all the benefits accruing therefrom under 35 U.S.C. § 119, the disclosure of which is incorporated herein by reference in its entirety.

BACKGROUND

1. Field

The present disclosure relates to magnetic junction memory devices and reading methods thereof.

2. Description of the Related Art

A random-access memory (RAM) may include a volatile memory and a nonvolatile memory. The volatile memory loses data present therein whenever the supply of power is cut off, and the nonvolatile memory retains its memory even when the supply of power is cut off.

A spin torque transfer-magnetic random-access memory (STT-MRAM), which is a type of nonvolatile memory, reads data by sensing the resistance state of a magnetic tunneling junction (MJT). Various read circuits have been suggested to read data from memory cells, but problems such as increases in the size of memory cell arrays and in read latency may inevitably arise due to the characteristics of a sensing operation. Therefore, research is needed to address these and other problems.

SUMMARY

Embodiments of the present disclosure provide magnetic junction memory devices capable of reducing the size of memory cell arrays and reducing read latency during read operations.

Embodiments of the present disclosure also provide reading methods of magnetic junction memory devices capable of reducing the size of memory cell arrays and reducing read latency during a read operation.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, there is provided a magnetic junction memory device including a sensing circuit including a sensing node, the sensing node being connected to a first end of a transistor and configured to change a voltage of the sensing node in accordance with a resistance of a magnetic junction memory cell, a gating voltage generator circuit configured to generate a gating voltage of the transistor using a reference resistor and a reference voltage, and a read circuit configured to read data from the magnetic junction memory cell using the reference voltage and the voltage of the sensing node.

According to the aforementioned and other embodiments of the present disclosure, a magnetic junction memory device including a memory cell array including more than one sub-memory cell array in which a plurality of magnetic junction memory cells are arranged, a reference memory cell array outside the more than one sub-memory cell array, and a sensing circuit configured to receive a gating voltage generated using the reference memory cell array, and reading data from the magnetic junction memory cells in the more than one sub-memory cell array.

According to the aforementioned and other embodiments of the present disclosure, a magnetic junction memory device including a memory cell array including more than one sub-memory cell array in which a plurality of magnetic junction memory cells are arranged, a reference memory cell array disposed at an edge part of the more than one sub-memory cell array and including a first resistor element group and a second resistor element group, a sensing circuit including a sensing node connected to a first end of a transistor and the sensing circuit being configured to change voltage in accordance with a resistance of each of the magnetic junction memory cells, a gating voltage generator circuit configured to generate a gating voltage of the transistor using a reference voltage and first and second reference resistors of the first and second resistor element groups, and a read circuit configured to read data from each of the magnetic junction memory cells in the more than one sub-memory cell array using the reference voltage and a voltage of the sensing node.

According to the aforementioned and other embodiments of the present disclosure, a magnetic junction memory device includes a first single-transistor common-gate amplifier circuit including a first transistor which is gated by a gating voltage and has a first end connected to a first sensing node, the first single-transistor common-gate amplifier circuit configured to determine a voltage of the first sensing node by applying a read current to a first reference resistor, a second single-transistor common-gate amplifier circuit including a second transistor which is gated by the gating voltage and has a first end connected to a second sensing node, the second single-transistor common-gate amplifier circuit configured to determine a voltage of the second sensing node by applying a read current to a second reference resistor, which has a different resistance from the first reference resistor, and a third single-transistor common-gate amplifier circuit including a second transistor which is gated by the gating voltage and has a first end connected to a third sensing node, the third single-transistor common-gate amplifier circuit configured to determine a voltage of the third sensing node by applying a read current to a magnetic junction memory cell.

According to the aforementioned and other embodiments of the present disclosure, a read method of a magnetic junction memory device including a sensing circuit which receives a gating voltage, generated using first and second reference resistors, and reads data from a magnetic junction memory cell using a reference voltage and a voltage of a sensing node that changes in accordance with a resistance of the magnetic junction memory cell, the read method including during a first period, developing a voltage of a first output node in accordance with the voltage of the sensing node and maintaining a voltage of a second output node at the reference voltage and during a second period, which follows the first period, developing the voltages of the first and second output nodes in accordance with the voltage of the sensing node.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which:

FIG. 6 is a conceptual layout view of a nonvolatile memory device according to some example embodiments of the present disclosure:

FIG. 13 is a conceptual layout view of a nonvolatile memory device according to some example embodiments of the present disclosure.

DETAILED DESCRIPTION

Embodiments of the present disclosure will hereinafter be described with reference to the accompanying drawings.

Figure 1:
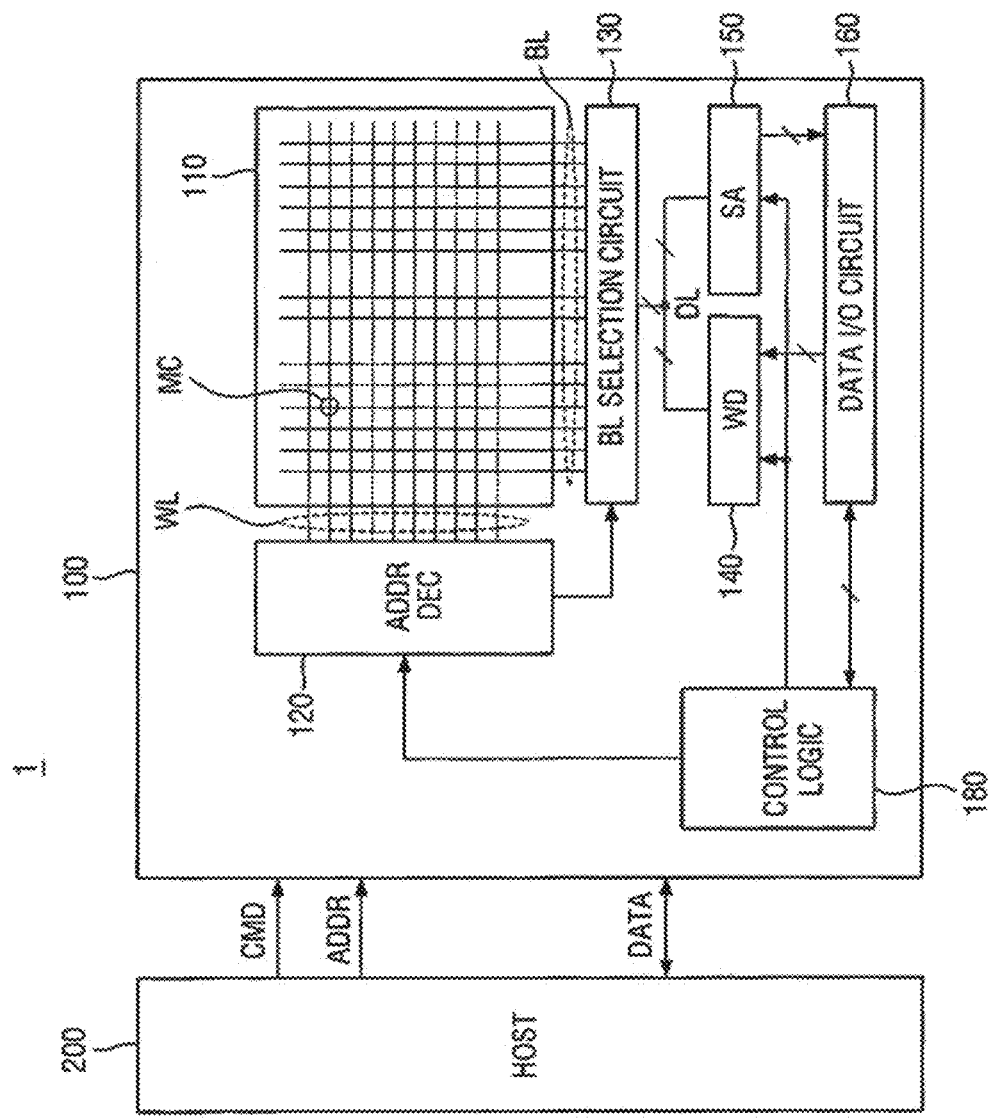
FIG. 1 illustrates a nonvolatile memory device according to some example embodiments of the present disclosure.

FIG. 1 illustrates a nonvolatile memory device according to some example embodiments of the present disclosure.

Referring to FIG. 1, a nonvolatile memory device 100 may read or write data in response to a request from a host 200.

Specifically, the nonvolatile memory device 100 may receive commands CMD and an address DDR from the host 200. The commands CMD may include a read command, a write command, and the like. In some example embodiments, where the host 200 transmits a read command to the nonvolatile memory device 100, the nonvolatile memory device 100 may provide data DATA read from a memory cell array 110 to the host 200.

In some example embodiments, where the host 200 transmits data DATA to be written and a write command to the nonvolatile memory device 100, the nonvolatile memory device 100 may write the data DATA to the memory cell array 110.

The nonvolatile memory device 100 may include the memory cell array 110, an address decoder circuit 120, a bitline selector circuit 130, a write driver circuit 140, a sense amplifier circuit 150, a data input/output (I/O) circuit 160, and a control logic 180, but the present disclosure is not limited thereto. That is, some of these elements may not be provided, or new elements may be added.

The address decoder circuit 120 (or other circuitry, for example, the bitline selector circuit 130, the write driver circuit 140, the sense amplifier circuit 150, the data input/output (I/O) circuit 160, the control logic 180, or other circuitry discussed herein) may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The memory cell array 110 may include a plurality of nonvolatile memory cells MC for storing data. The memory cells MC may include variable resistance elements whose resistance corresponds to data stored therein, for example, magnetic tunnel junctions (MTJs).

In some example embodiments, the nonvolatile memory device 100 may also be referred to as a resistive random-access memory (RRAM or ReRAM) device. For example, the memory cell array 110 of the nonvolatile memory device 100 may include phase-change random-access memories (PRAMs) or ferroelectric random-access memories (FRAMs), or may include magnetic random-access memories (MRAMs) such as spin transfer torque-magnetic random access memories (STT-MRAMs), spin torque transfer magnetization switching random-access memories (spin-RAMs), or spin momentum transfer-random access memories (SMT-RAMs).

Some example embodiments of the nonvolatile memory device 100 will hereinafter be described as being an MRAM device, but the present disclosure is not limited thereto.

The memory cell array 110 may include one or more memory cells MC to which data can be written. Specifically, the memory cell array 110 may include memory cells MC which are arranged at locations corresponding to a plurality of wordlines WL and a plurality of bitlines BL. The memory cells MC will be described later in detail.

In some example embodiments, the memory cell array 110 may include one or more sub-memory cell arrays, and each of the sub-memory cell arrays may include a predetermined number of memory cells MC. That is, a plurality of sub-memory cell arrays in each of which a predetermined number of memory cells MC and wordlines WL and bitlines BL for controlling the memory cells MC are arranged may be gathered to form the memory cell array 110.

In some example embodiments, data DATA may be read or written in units of the sub-memory cell arrays. In some example embodiments, the nonvolatile memory device 100 may write or read data in units of four sub-memory cell arrays (e.g., in units of memory banks), but the present disclosure is not limited thereto.

The address decoder circuit 120 may receive the address ADDR and may decode the address ADDR into row and column addresses. The address decoder circuit 120 may select one of the wordlines WL in accordance with the row address. In some example embodiments, the address decoder circuit 120 may transmit the column address to the bitline selector circuit 130. For example, the address decoder circuit 120 may include a row decoder, a column decoder, an address buffer, and the like.

The bitline selector circuit 130 may be connected to the memory cell array 110 via the bitlines BL and may also be connected to the write driver circuit 140 and the sense amplifier circuit 150. The bitline selector circuit 130 may operate under the control of the control logic 180. The bitline selector circuit 130 may be configured to receive a decoded column address from the address decoder circuit 120.

The bitline selector circuit 130 may select one of the bitlines BL using a decoded column address. For example, during a write operation, the bitline BL by the bitline selector circuit 130 may be connected to a data line DL and may thus be connected to the write driver circuit 140. During a read operation, the bitline selector circuit 130 may connect the selected bitline BL to the sense amplifier circuit 150.

The write driver circuit 140 may operate under the control of the control logic 180. The write driver circuit 140 may program a memory cell MC connected to the bitline BL selected by the bitline selector circuit 130 and the wordline WL selected by the address decoder circuit 120. The write driver circuit 140 may generate a current or a voltage based on data input thereto from the data I/O circuit 160 and may output the generated current or voltage to the selected bitline BL.

In some example embodiments, the write driver circuit 140 may include a local write driver for writing data to the memory cells MC and a global write driver for providing a write control signal and/or write data to the local write driver.

The sense amplifier circuit 150 may operate under the control of the control logic 180. The sense amplifier circuit 150 may include a read circuit which detects a memory cell MC connected to the bitline BL selected by the bitline selector circuit 130 and to the wordline WL selected by the address decoder circuit 120.

The read circuit may read data from the detected memory cell MC by detecting a current that flows in the selected bitline BL or a voltage applied to the selected bitline BL. The sense amplifier circuit 150 may output the read data to the data I/O circuit 160.

The data I/O circuit 160 may operate under the control of the control logic 180. The data V/O circuit 160 may transmit data input thereto from the outside to the write driver circuit 140 and may output data input thereto from the sense amplifier circuit 150 to the outside.

The control logic 180 may control the general operation of the nonvolatile memory device 100. For example, the control logic 180 may control the address decoder circuit 120, the bitline selector circuit 130, the write driver circuit 140, the sense amplifier circuit 150, and the data I/O circuit 160. The control logic 180 may operate in response to commands or control signals input thereto from the outside.

Figure 2:
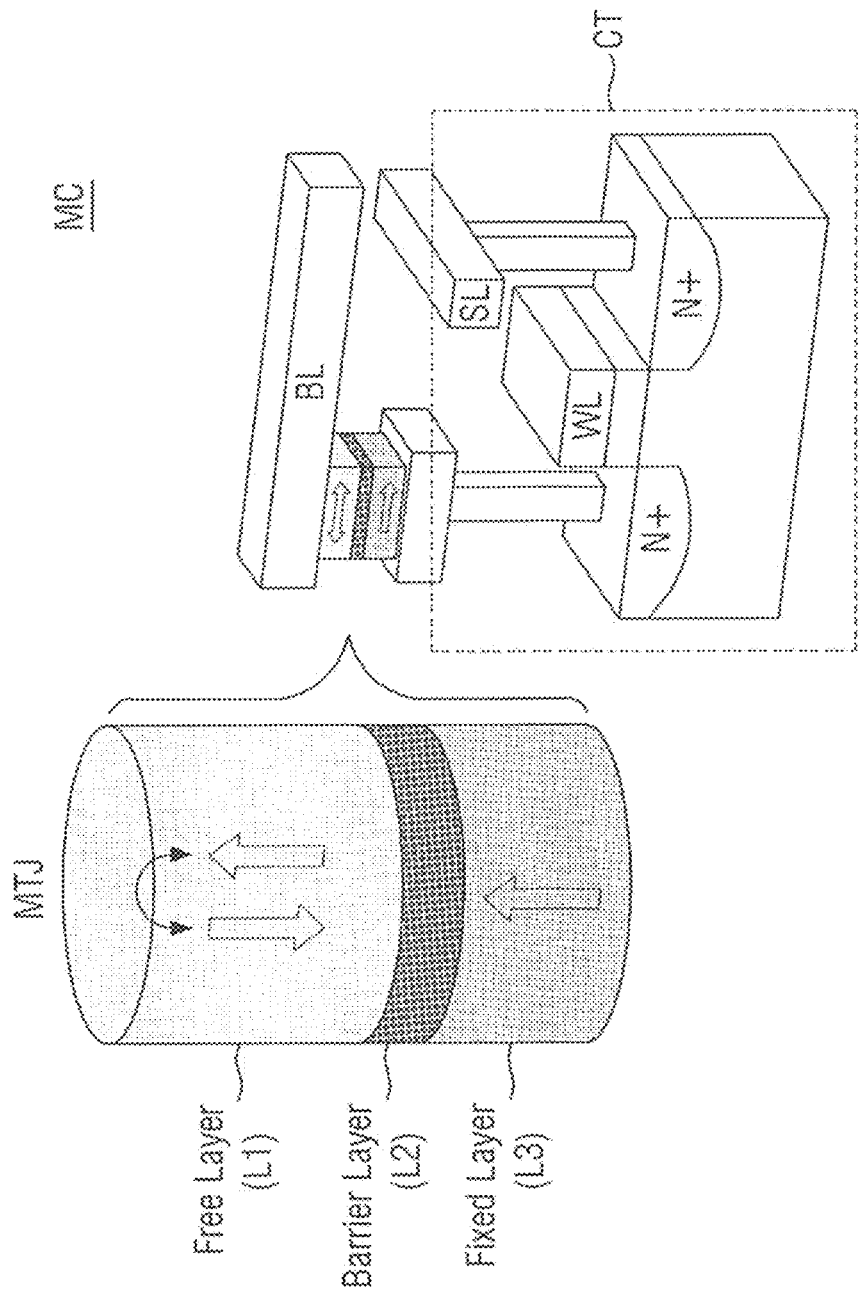
FIG. 2 illustrates a memory cell according to some example embodiments of the present disclosure.
Figure 3:
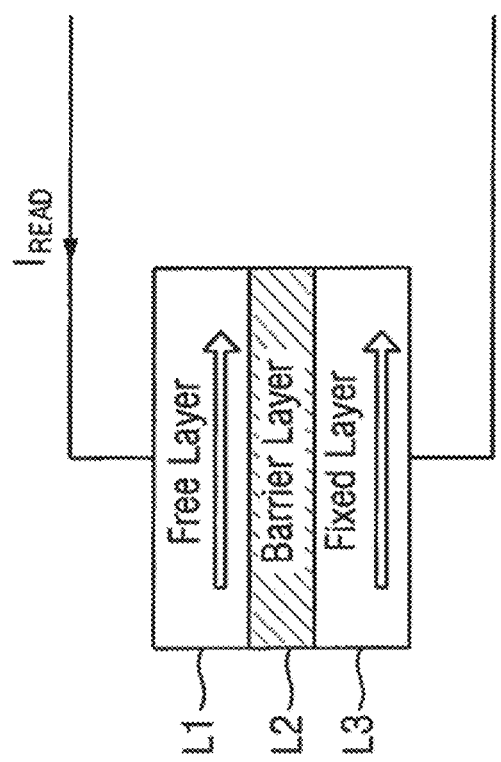
FIGS. 3 and 4 illustrate how to store data in accordance with the magnetization direction of a memory cell.
Figure 4:
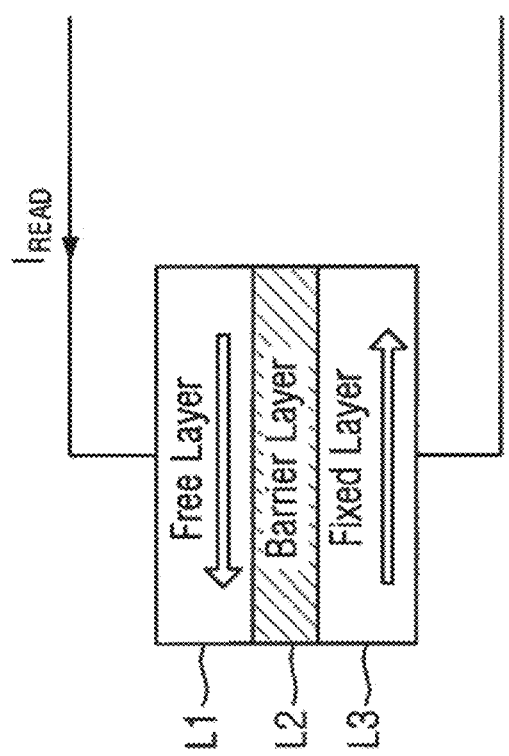

FIG. 2 illustrates a memory cell according to some example embodiments of the present disclosure. FIGS. 3 and 4 illustrate how to store data in accordance with the magnetization direction of a memory cell.

Referring to FIG. 2, a memory cell MC may include a variable resistance element MTJ and a cell transistor CT. The gate of the cell transistor CT may be connected to a wordline WL. A first electrode of the cell transistor CT may be connected to a bitline BL via the variable resistance element MTJ. A second electrode of the cell transistor CT may be connected to a source line SL.

In some example embodiments, the wordline WL and the source line SL may extend in the same direction, but the present disclosure is not limited thereto. In other embodiments, the wordline WL and the source line SL may extend in different directions that form a right angle, but the present disclosure is not limited thereto.

The variable resistance element MTJ may include a free layer L1, a fixed layer L3, and a barrier layer L2 which is disposed between the free layer L1 and the fixed layer L3. The magnetization direction of the fixed layer L3 may be fixed, and the magnetization direction of the free layer L1 may be the same as, or opposite to, the magnetization direction of the fixed layer L3. In order to fix the magnetization direction of the fixed layer L3, the variable resistance element MTJ may further include an antiferromagnetic layer.

In some example embodiments, the free layer L1 may include a material having a variable magnetization direction. The magnetization direction of the free layer L1 may be changed by an electrical/magnetic factor from within or outside the memory cell MC. The free layer L1 may include a ferromagnetic material containing at least one of cobalt (Co), iron (Fe), and/or nickel (Ni). For example, the free layer L may include at least one selected from among FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and/or Y3Fe5O12.

The barrier layer L2 may have a thickness smaller than a spin diffusion distance. The barrier layer L2 may include a nonmagnetic material. For example, the barrier layer L2 may be formed of at least one selected from among oxides of magnesium (Mg), titanium (Ti), aluminum (Al), magnesium-zinc (MgZn), and magnesium-boron (MgB) and nitrides of titanium (Ti) and/or vanadium (V).

The fixed layer L3 may have a fixed magnetization direction due to the antiferromagnetic layer. The fixed layer L3 may include a ferromagnetic material. For example, the fixed layer L3 may include at least one selected from among CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and/or Y3Fe5O12.

In some example embodiments, the antiferromagnetic layer may include an antiferromagnetic material. For example, the antiferromagnetic layer may include at least one selected from among PtMn, IrMn, MnO, MnS, MnTe, MnF2, FeCl2, FeO, CoCl2, CoO, NiCl2, NiO, and/or Cr.

When a read operation is being performed on the memory cell MC, a high-level voltage (e.g., a logic-high voltage) may be provided to the wordline WL. Then, the cell transistor CT may be turned on in response to the voltage provided to the wordline WL. Also, in order to measure the resistance of the variable resistance element MTJ, a read current IREAD may be provided from the bitline BL in the direction of the source line SL or from the source line SL in the direction of the bitline BL. Data stored in the variable resistance element MTJ may be determined based on the resistance measured from the variable resistance element MTJ.

The resistance of the variable resistance element MTJ may vary depending on the magnetization direction of the free layer L1. In response to the read current IREAD being provided to the variable resistance element MTJ, a data voltage is output in accordance with the resistance of the variable resistance element MTJ. Since the intensity of the read current IREAD is much smaller than the intensity of a write current, the magnetization direction of the free layer L1 is not changed by the read current IREAD.

Referring to FIG. 3, in some example embodiments, the magnetization direction of the free layer L1 and the magnetization direction of the fixed layer L3 may be parallel (p) to each other. In some example embodiments, the variable resistance element MTJ may have a low resistance Rp, and the data stored in the variable resistance element 1 may be determined as being, for example, "0".

However, referring to FIG. 4, in some example embodiments, the magnetization direction of the free layer L and the magnetization direction of the fixed layer L3 may be antiparallel (ap) to each other. In some example embodiments, the variable resistance element MTJ may have a high resistance Rap, and the data stored in the variable resistance element 1 may be determined as being, for example, "1".

FIG. 2 illustrates the free layer L1 and the fixed layer L3 of the variable resistance element MTJ as being horizontal magnetic elements, but the present disclosure is not limited thereto. Alternatively, the free layer L1 and the fixed layer L3 of the variable resistance element MTJ may be provided as vertical magnetic elements.

Figure 5:
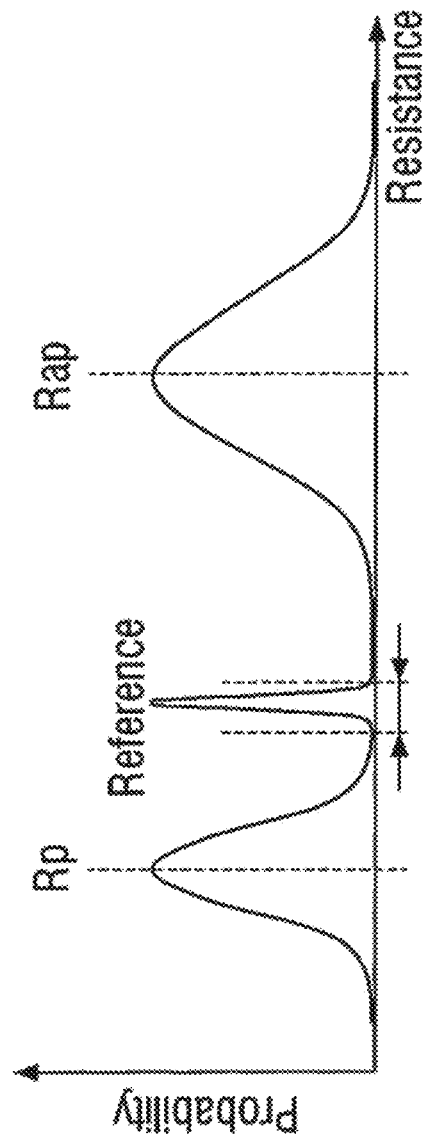
FIG. 5 illustrates how to set the reference resistance of a memory cell according to some example embodiments of the present disclosure.

FIG. 5 illustrates how to set the reference resistance of a memory cell according to some example embodiments of the present disclosure.

Referring to FIG. 5, a reference resistance for differentiating a data value of "0" from a data value of "1" may be determined to range between a first resistance Rp and a second resistance Rap. Here, the first resistance Rp corresponds to the resistance of a memory cell MC when the magnetization direction of a free layer L1 of a variable resistance element MTJ of the memory cell MC is parallel (p) to the magnetization of a fixed layer L3 of the variable resistance element MTJ of the memory cell MC, and the second resistance Rap corresponds to the resistance of the memory cell MC when the magnetization direction of the free layer L1 is anti-parallel (ap) to the magnetization of the fixed layer L3. Data stored in the memory cell MC can be reliably read by designing a reference voltage or current, which is for use in identifying the data stored in the memory cell MC, to properly reflect the reference resistance of the memory cell MC.

Figure 7:
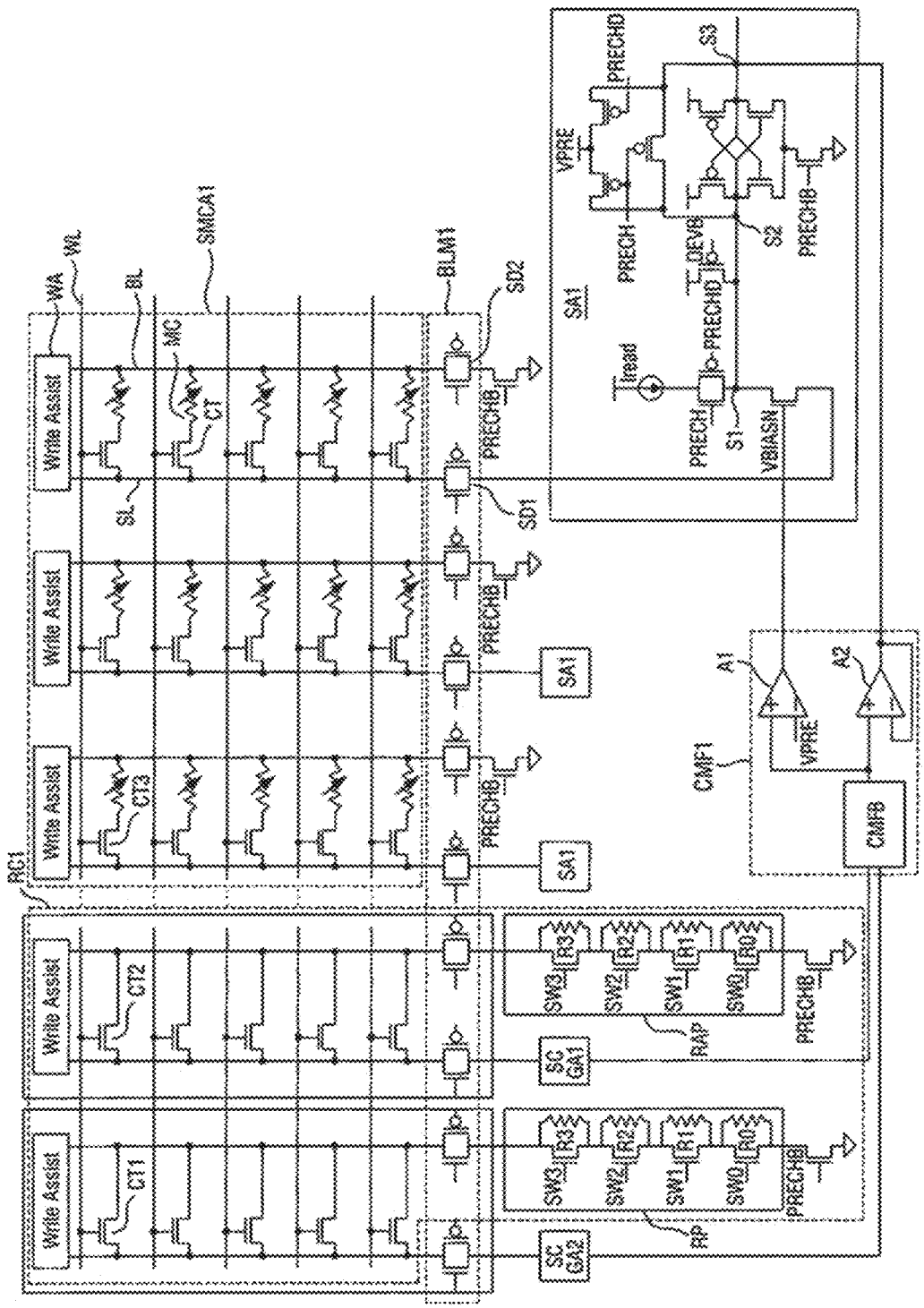
FIG. 7 is a circuit diagram of part of the nonvolatile memory device of FIG. 6.

FIG. 6 is a conceptual layout view of a nonvolatile memory device according to some example embodiments of the present disclosure. FIG. 7 is a circuit diagram of part of the nonvolatile memory device of FIG. 6.

Referring to FIGS. 5 and 6, a nonvolatile memory device 100 may include a plurality of sub-memory cell arrays SMCA1 and SMCA2. The sub-memory cell arrays SMCA1 and SMCA2 may form the memory cell array 110 of FIG. 1. In other words, the memory cell array 110 of FIG. 1 may be divided into the sub-memory cell arrays SMCA1 and SMCA2. The nonvolatile memory device 100 is illustrated as including two sub-memory cell arrays SMCA1 and SMCA2, but the present disclosure is not limited thereto.

Referring to FIG. 7, each of the sub-memory cell arrays SMCA1 through SMCA16 may include a plurality of memory cells MC. FIG. 7 illustrates only part of the nonvolatile memory device 100 of FIG. 6, but obviously, a description of the part of the nonvolatile memory device 100 may be directly applicable to the rest of the nonvolatile memory device 100.

A plurality of memory cells MC may be connected to a plurality of cell transistors CT. The gates of the cell transistors CT may be connected to wordlines WL, and first ends of cell transistors CT that are not connected to the memory cells MC may be connected to source lines SL. The memory cells MC may be connected to bitlines BL.

In some example embodiments, the source lines SL and the bitlines BL may be connected to a write assist circuit WA which is for use in a write operation.

Referring again to FIG. 6, a reference memory cell array RC1 may include reference resistors necessary for reading data from the memory cells MC included in the sub-memory cell array SMCA1, and a reference memory cell array RC2 may include reference resistors necessary for reading data from the memory cells MC included in the sub-memory cell array SMCA2.

Specifically, referring to FIG. 7, the reference memory cell array RC1 may be almost similar to the sub-memory cell array SMCA1, and no memory cells MC may be disposed in the reference memory cell array RC1. The reference memory cell array RC1 may include a bitline BL which is connected to a first resistor element group having a first resistance RP and a bitline BL which is connected to a second resistor element group having a second resistance RAP.

In some example embodiments, the first and second resistor element groups may be disposed in the reference memory cell array RC1, but the present disclosure is not limited thereto. Alternatively, the first and second resistor element groups may be disposed in a predetermined region outside the reference memory cell array RC1.

Cell transistors CT disposed in the reference memory cell array RC1 may share wordlines WL with cell transistors CT disposed in the sub-memory cell array SMCA1. Specifically, cell transistors CT1 connected to the first resistor element group with the first resistance RP, cell transistors CT2 connected to the second resistor element group with the second resistance RAP, and cell transistors CT3 connected to memory cells MC may share the wordlines WL. In some example embodiments, the second resistance RAP may be higher than the first resistance RP.

Referring again to FIG. 6, the reference memory cell arrays RC1 and RC2 may be disposed outside the sub-memory cell arrays SMCA1 and SMCA2. Specifically, the reference memory cell array RC1 may be disposed at an edge part of the sub-memory cell array SMCA1, and the reference memory cell array RC2 may be disposed at an edge part of the sub-memory cell array SMCA2.

In some example embodiments, the sub-memory cell arrays SMCA1 and SMCA2 may be disposed to adjacent to each other. In other words, the reference memory cell arrays RC1 and RC2 may not be disposed between the sub-memory cell arrays SMCA1 and SMCA2. However, the present disclosure is not limited thereto. Alternatively, the reference memory cell arrays RC1 and RC2 may be disposed between the sub-memory cell arrays SMCA1 and SMCA2, as necessary. In some example embodiments, the reference memory cell arrays RC1 and RC2 may not be disposed inside the sub-memory cell arrays SMCA1 and SMCA2.

Since reference resistors necessary for reading data from memory cells MC are not disposed in the sub-memory cell arrays SMCA1 and SMCA2, the size of an entire memory cell array can be reduced as compared to a case where reference resistors or reference memory cells are provided in each of the sub-memory cell arrays SMCA1 and SMCA2.

Bitline multiplexers BLM1 and BLM2 may be disposed outside the sub-memory cell arrays SMCA1 and SMCA2. Specifically, referring to FIG. 7, the bitline multiplexer BLM1 may include a first selection element SD1 which selects a source line SL disposed in the reference memory cell array RC1 and a source line SL disposed in the sub-memory cell array SMCA1 in response to a predetermined control signal and a second selection element SD2 which selects a source line SL disposed in the reference memory cell array RC2 and a source line SL disposed in the sub-memory cell array SMCA2 in response to a predetermined control signal.

Referring again to FIG. 6, common-mode feedback amplifier circuits CMF1 and CMF2, sensing circuits SA1 and SA2, write drivers WD1 and WD2, and column decoders CDEC1 and CDEC2 may be disposed adjacent to the bitline multiplexers BLM1 and BLM2, but the present disclosure is not limited thereto.

Referring to FIG. 7, the common-mode feedback amplifier circuit CMF1 may include a common-mode feedback block CMFB and amplifier circuits A1 and A2. In some example embodiments, the common-mode feedback amplifier circuit CMF1 may further include single-transistor common-gate amplifier circuits SCGA1 and SCGA2 which are connected to source lines SL disposed in the reference memory cell array RC1. The operation of the common-mode feedback amplifier circuit CMF1 will be described later.

A plurality of sensing circuits SA1 may be provided. Specifically, separate sensing circuits SA1 may be provided for separate source lines SL disposed in the sub-memory cell array SMCA1. Each of the sensing circuits SA1 may include a single-transistor common-gate amplifier circuit, a precharge circuit, and a cross-coupled latch. The operation of the sensing circuits SA1 will be described later.

An example embodiment of the common-mode feedback amplifier circuit CMF1 and the sensing circuit SA1 will hereinafter be described in further detail with reference to FIGS. 8 and 9.

Figure 8:
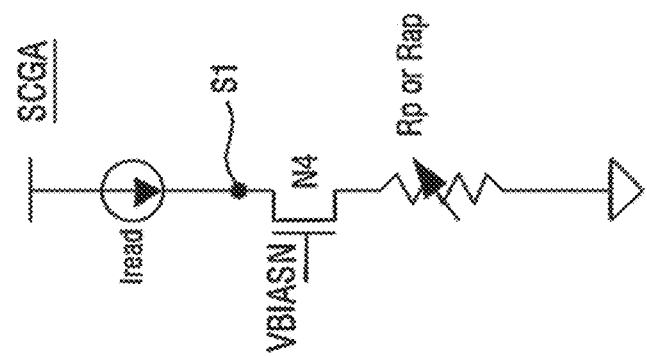
FIG. 8 is a circuit diagram illustrating the operation of a single-transistor common-gate amplifier circuit.

FIG. 8 is a circuit diagram illustrating the operation of a single-transistor common-gate amplifier circuit.

Referring to FIG. 8, a single-transistor common-gate amplifier circuit SCGA may include a transistor N4. The transistor N4 may be gated by a gating voltage VBIASN to flow a read current Iread, which is provided by a constant current source at one end of the single-transistor common-gate amplifier circuit SCGA, to a resistor at the other end of the single-transistor common-gate amplifier circuit SCGA. If the resistor has a low resistance (e.g., the first resistance RP), the gate-source voltage (Vgs) of the transistor N4 increases when the read current Iread flows into the transistor N4, and as a result, the voltage of a sensing node S1 decreases. In some example embodiments, when the resistor has a high resistance (e.g., the second resistance RAP), the gate-source voltage (Vgs) of the transistor N4 decreases when the read current Iread flows into the transistor N4, and as a result, the voltage of the sensing node S1 increases. That is, the resistance of the resistor can be identified based on the voltage of the sensing node S1. In other words, data programmed into a magnetic junction memory cell can be read.

By using the single-transistor common-gate amplifier circuit SCGA, data can be read from a magnetic junction memory cell. This will hereinafter be described in further detail with reference to FIGS. 7 through 9.

Figure 9:
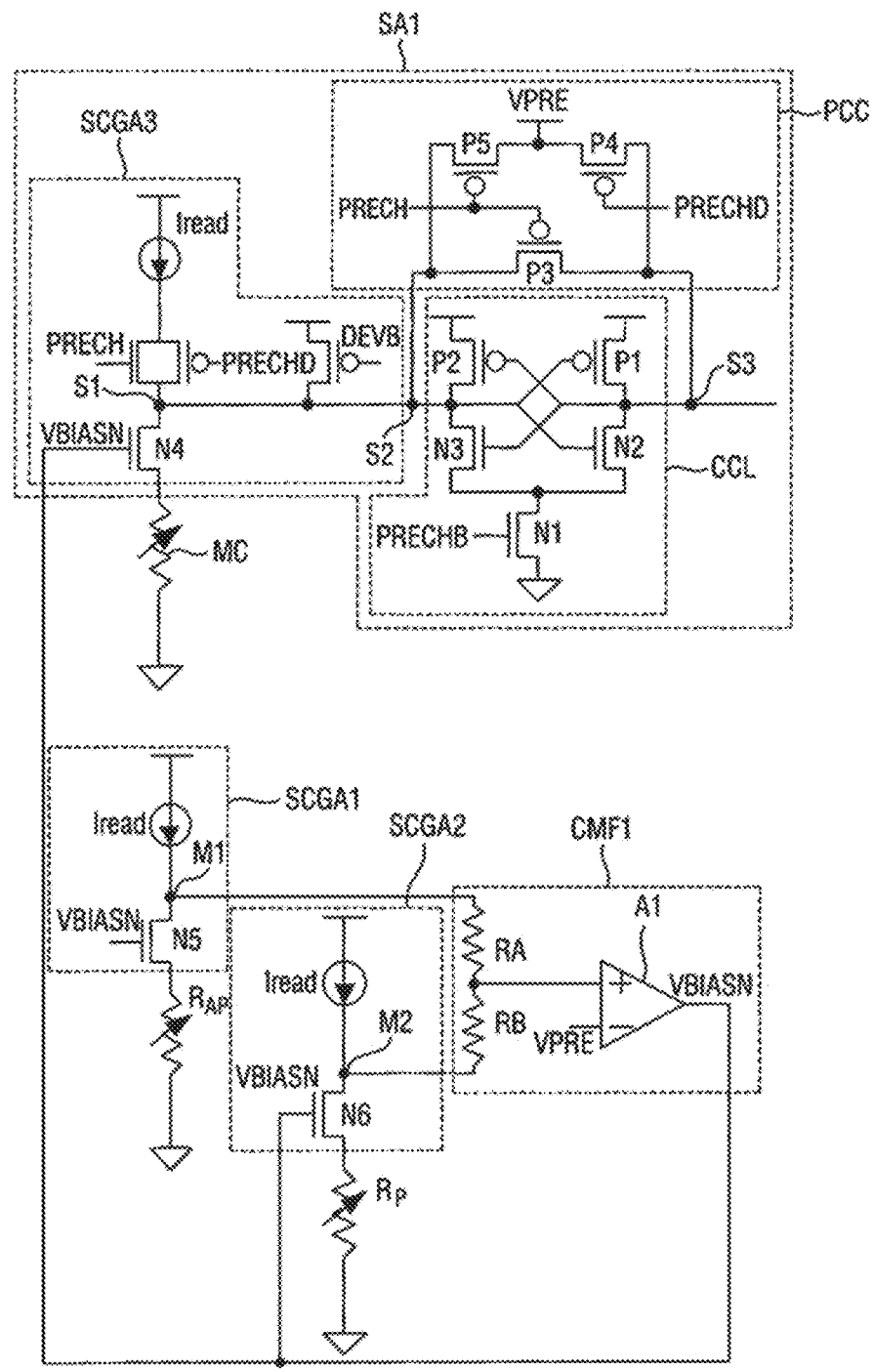
FIG. 9 is a circuit diagram of the circuit illustrated in FIG. 7.

FIG. 9 is a circuit diagram of the circuit illustrated in FIG. 7.

Referring to FIGS. 7 and 9, a transistor N5 of the first single-transistor common-gate amplifier circuit SCGA1 may be gated by a gating voltage VBIASN to flow a read current Iread, which is provided by a constant current source at one end of the first single-transistor common-gate amplifier circuit SCGA1, to a resistor at the other end of the first single-transistor common-gate amplifier circuit SCGA1. Since the other end of the first single-transistor common-gate amplifier circuit SCGA1 is connected to the second resistor element group with the second resistance RAP, the read current Iread flows into the second resistor element group with the second resistance RAP.

A transistor N6 of a second single-transistor common-gate amplifier circuit SCGA2 may be gated by the gating voltage VBIASN to flow the read current Iread, which is provided by a constant current source at one end of the second single-transistor common-gate amplifier circuit SCGA2, to a resistor at the other end of the second single-transistor common-gate amplifier circuit SCGA2. Since the other end of the second single-transistor common-gate amplifier circuit SCGA2 is connected to the first resistor element group with the first resistance RP, the read current Iread flows into the first resistor element group with the first resistance RP.

Since the second resistance RAP is higher than the first resistance RP, the voltage of a sensing node M1 may become higher than the voltage of a sensing node M2.

A common-mode feedback amplifier circuit CMF1 may include a voltage divider circuit which includes first and second voltage divider resistors RA and RB and an amplifier A1 which has first and second input terminals.

A voltage corresponding to the difference between the voltage of the sensing node M1 and the voltage of the sensing node M2 may be provided to the first input terminal of the amplifier A1 through the voltage divider circuit. Here, the voltage provided to the first input terminal of the amplifier A1 may vary depending on the resistances of the first and second divider resistors RA and RB. A reference voltage VPRE may be provided to the second input terminal of the amplifier A1. The reference voltage VPRE may be used to read data stored in a memory cell MC.

The gating voltage VBIASN, which is the output of the amplifier A1, may be fed back to the gates of the transistors N5 and N6, and the above-described processes are repeated. As this feedback loop is continued, the gating voltage VBIASN, which is to be used in the sensing circuit SA1, is determined. That is, the gating voltage VBIASN is adjusted so that the read current Iread of the sensing circuit SA1 can be set between the first and second resistances Rp and Rap of the memory cell MC. That is, the gating voltage VBIASN is determined by reflecting the distributions of the first and second resistances Rp and Rap of a reference memory cell. Accordingly, reliable sensing margins can be secured when reading data from the memory cell MC using the reference voltage VPRE.

The sensing circuit SA1 may include a third single-transistor common-gate amplifier circuit SCGA3, a precharge circuit PCC, and a cross-coupled latch CCL.

A transistor N4 of the third single-transistor common-gate amplifier circuit SCGA3 may be gated by the gating voltage VBIASN, which is output from a common-mode feedback amplifier circuit CMF1, to flow the read current Iread, which is provided by a constant current source at one end of the third single-transistor common-gate amplifier circuit SCGA3, to a memory cell MC included in a sub-memory cell array (e.g., the sub-memory cell array SMCA1 of FIGS. 5 and 6) at the other end of the third single-transistor common-gate amplifier circuit SCGA3. The voltage of the sensing node S1 may vary depending on the data stored in the memory cell MC. For example, in some example embodiments, where the memory cell MC has the first resistance Rp, the voltage of the sensing node S1 may decrease, and in some example embodiments, where the memory cell MC has the second resistance Rap, the voltage of the sensing node S1 may increase.

The precharge circuit PCC may precharge first and second output nodes S2 and S3 to the reference voltage VPRE. To this end, the precharge circuit PCC may include transistors P3 and P5 which are gated by a first precharge signal PRECH and a transistor P4 which is gated by a second precharge signal PRECHD.

The cross-coupled latch CCL may develop the voltages of the first and second output nodes S2 and S3 in accordance with the voltage of the sensing node S1 and may latch the data stored in the memory cell MC based on the developed voltages. The cross-coupled latch CCL may include a transistor P1 which is gated by the voltage of the first output node to pull up the second output node S3, a transistor N2 which is gated by the voltage of the first output node S2 to pull down the second output node S3, a transistor P2 which is gated by the voltage of the second output node S3 to pull up the first output node S2, a transistor N3 which is gated by the voltage of the second output node S3 to pull down the first output node S2, and a transistor N1 which is gated by a third precharge signal PRECHB to connect the ends of the transistors N2 and N3 to a ground voltage.

Figure 10:
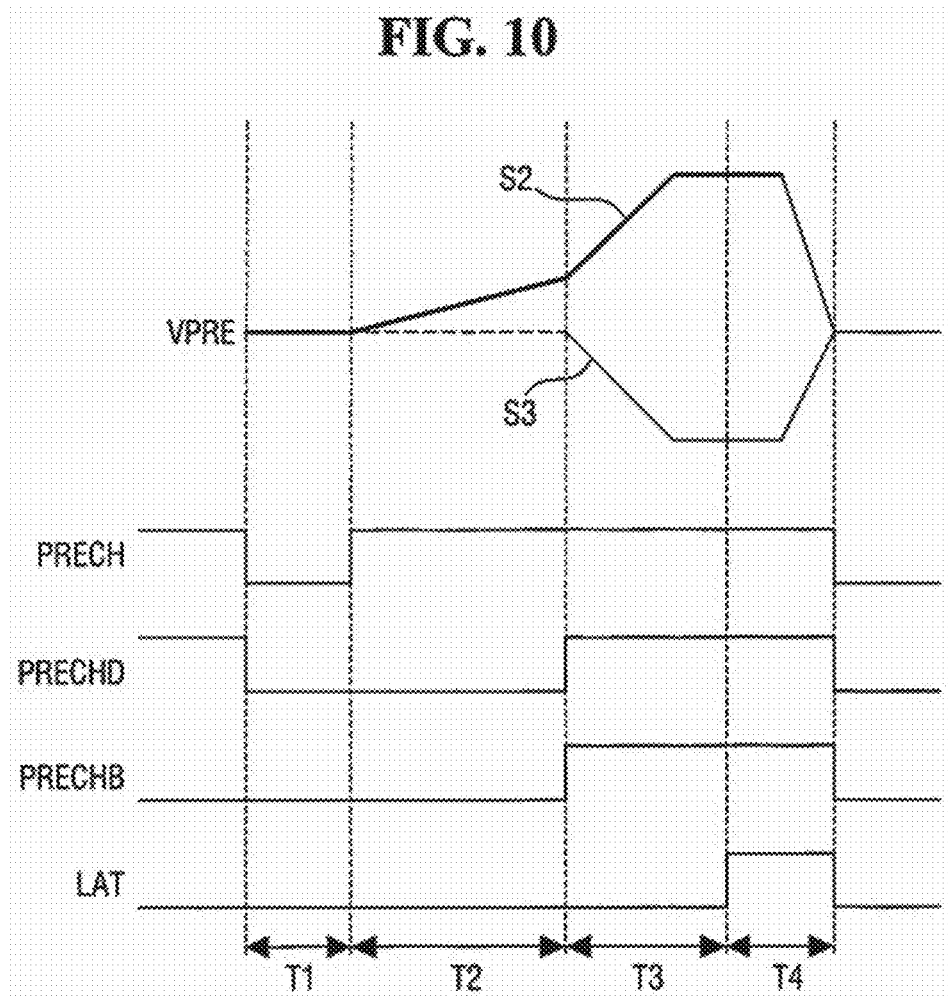
FIGS. 10 and 11 are timing diagrams illustrating a read operation of a nonvolatile memory device according to some example embodiments of the present disclosure.
Figure 11:
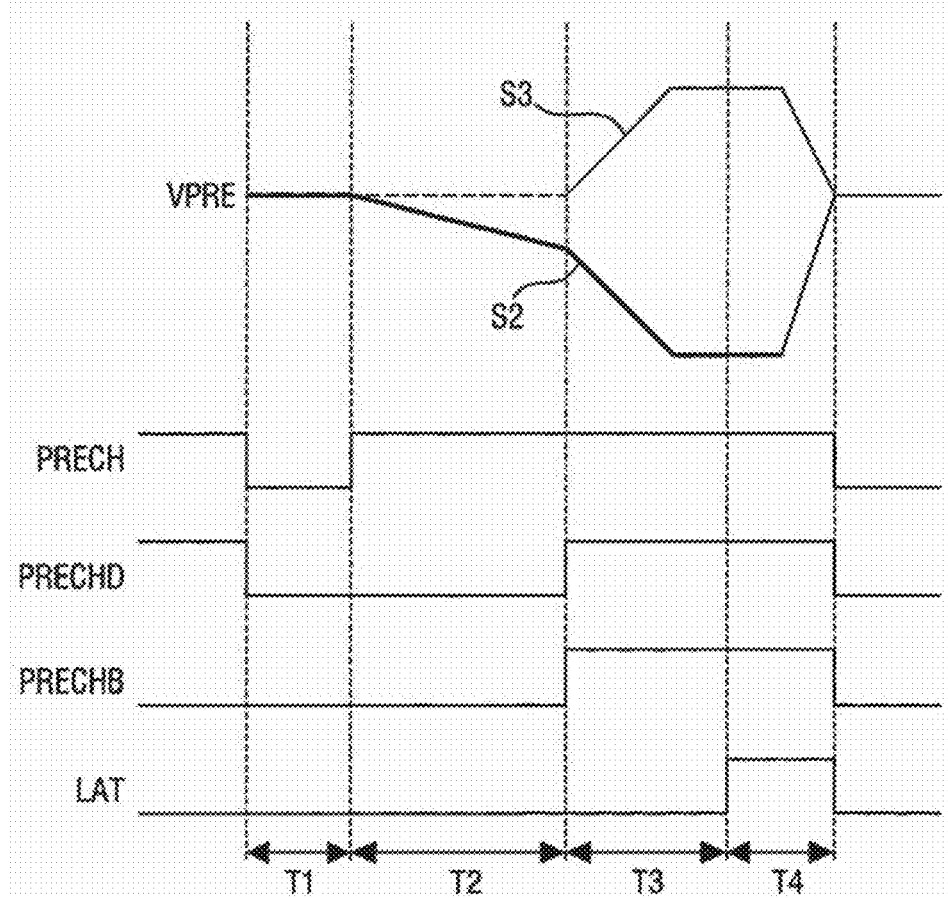

FIGS. 10 and 11 are timing diagrams illustrating a read operation of a nonvolatile memory device according to some example embodiments of the present disclosure.

Specifically, FIG. 10 is a timing diagram illustrating a read operation of a nonvolatile memory device according to some example embodiments of the present disclosure when memory cells MC have the second resistance RAP, and FIG. 11 is a timing diagram illustrating a read operation of the nonvolatile memory device when the memory cells MC have the first resistance RP.

Referring to FIG. 10, during a first operating period T1, first, second, and third precharge signals PRECH, PRECHD, and PRECHB are inactivated. Accordingly, first and second output nodes S2 and S3 are precharged to a reference voltage VPRE. Since a read current Iread is not provided to a sensing node S1, the sensing node S1 is also precharged to the reference voltage VPRE.

During a second operating period T2, the second and third precharge signals PRECHD and PRECHB are still inactivated, but the first precharge signal PRECH is activated. Accordingly, the read current Iread is provided to the sensing node S1, and the voltage of the sensing node S1 increases due to the resistance (RAP) of memory cells MC.

Meanwhile, since the reference voltage is no longer provided to the first output node S2, the voltage of the first output node S2 increases along with the voltage of the sensing node S1. Since the reference voltage VPRE is continuously provided to the second output node S3, the voltage of the second output node S3 is maintained at the reference voltage VPRE.

During a third operating period T3, the second and third precharge signals PRECHD and PRECHB are activated. Accordingly, the read current Iread is no longer provided to the sensing node S1, and the reference voltage VPRE is no longer provided to the second output node S3. Thus, the voltages of the first and second output nodes S2 and S3 are amplified by transistors P1, P2, N1, N2, and N3. That is, the voltage of the first output node S2 is developed to increase, and the voltage of the second output node S3 is developed to decrease.

During a fourth operating period T4, in response to a latch signal LAT being enabled, data of the memory cells MC is latched in accordance with the voltages of the first and second output nodes S2 and S3. Since the voltage of the first output node S2 is higher than the voltage of the second output node S3, a data value of, for example, "1", is latched.

Referring to FIG. 11, during the first operating period T1, the first, second, and third precharge signals PRECH, PRECHD, and PRECHB are inactivated. Accordingly, the first and second output nodes S2 and S3 are precharged to the reference voltage VPRE. Since the read current Iread is not provided to the sensing node S1, the sensing node S1 is also precharged to the reference voltage VPRE.

During the second operating period T2, the second and third precharge signals PRECHD and PRECHB are still inactivated, but the first precharge signal PRECH is activated. Accordingly, the read current Iread is provided to the sensing node S1, and the voltage of the sensing node S1 decreases due to the resistance (RAP) of memory cells MC.

Meanwhile, since the reference voltage is no longer provided to the first output node S2, the voltage of the first output node S2 decreases along with the voltage of the sensing node S1. Since the reference voltage VPRE is continuously provided to the second output node S3, the voltage of the second output node S3 is maintained at the reference voltage VPRE.

During the third operating period T3, the second and third precharge signals PRECHD and PRECHB are activated. Accordingly, the read current Iread is no longer provided to the sensing node S1, and the reference voltage VPRE is no longer provided to the second output node S3. Thus, the voltages of the first and second output nodes S2 and S3 are amplified by transistors P1, P2, N1, N2, and N3. That is, the voltage of the first output node S2 is developed to decrease, and the voltage of the second output node S3 is developed to increase.

During the fourth operating period T4, in response to the latch signal LAT being enabled, data of the memory cells MC is latched in accordance with the voltages of the first and second output nodes S2 and S3. Since the voltage of the first output node S2 is lower than the voltage of the second output node S3, a data value of, for example, "0", is latched.

Since reference resistors or reference memory cells are not disposed in the sub-memory cell arrays SMCA1 and SMCA2, the size of an entire memory cell array can be reduced, and data programmed into the memory cells MC can be read with a small read latency.

As already mentioned, a gating voltage VBIASN is adjusted so that the read current Iread can range between the first and second resistances RP and RAP. As the voltage of the sensing node S1 changes in accordance with the first and second resistances RP and RAP of the memory cells MC, data stored in the memory cells MC can be read.

However, when the first and second resistances RP and RAP are low, sensing margins that can be secured are small, the actual distribution of the memory cells MC may need to be considered to determine the read current Iread. Also, since the read current Iread needs to flow directly to the memory cells MC to sense the resistance of the memory cells MC, it may be difficult to choose a read current Iread capable of securing sufficient sensing margins while preventing the memory cells MC from being programmed. Some example embodiments of a read circuit for addressing this and other problems will hereinafter be described with reference to FIG. 12.

Figure 12:
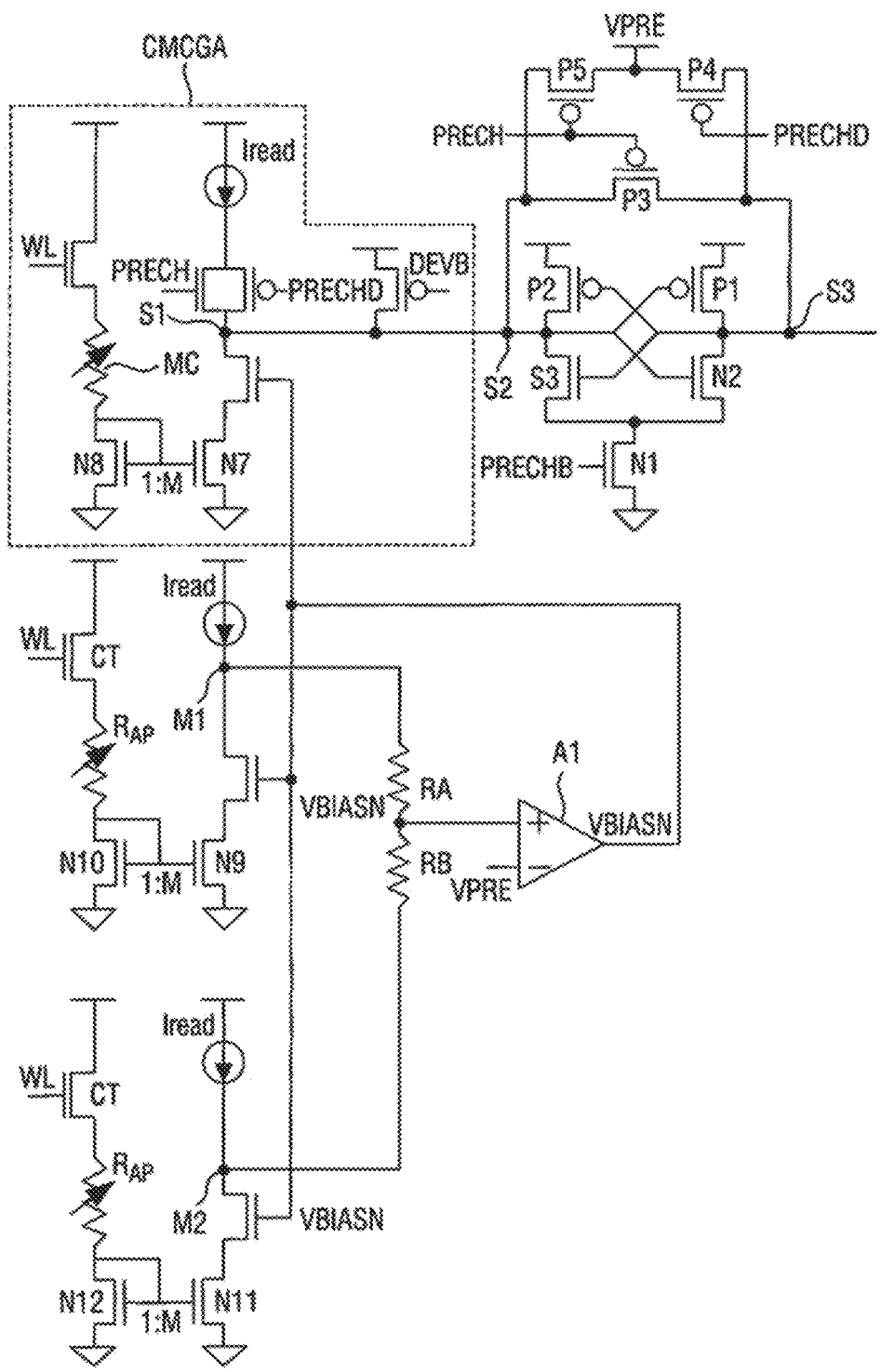
FIG. 12 is a circuit diagram of a read circuit according to some example embodiments of the present disclosure.

FIG. 12 is a circuit diagram of a read circuit according to some example embodiments of the present disclosure.

Referring to FIG. 12, the read circuit may include a current mirror circuit CMCGA which makes a read current Iread flowing in sensing nodes S1, M1, and M2 and a read current Iread applied to a memory cell MC differ. A structure for applying a read current Iread to the memory cell MC is the same as in the above-described embodiments, but in the example embodiment of FIG. 12, the read current Iread actually applied to the memory cell MC using the current mirror circuit CMCGA and a read current Iread for use in reading data stored in the memory cell MC may be made to differ at a ratio of 1:M (where M is a natural number of 2 or greater).

Accordingly, a read disturb rate (RDR) issue that may arise when a read current Iread is applied to the memory cell MC can be addressed, and lead latency can be minimized by reading data from the memory cell MC using a higher read current Iread than the read current actually applied to the memory cell MC.

Figure 13:
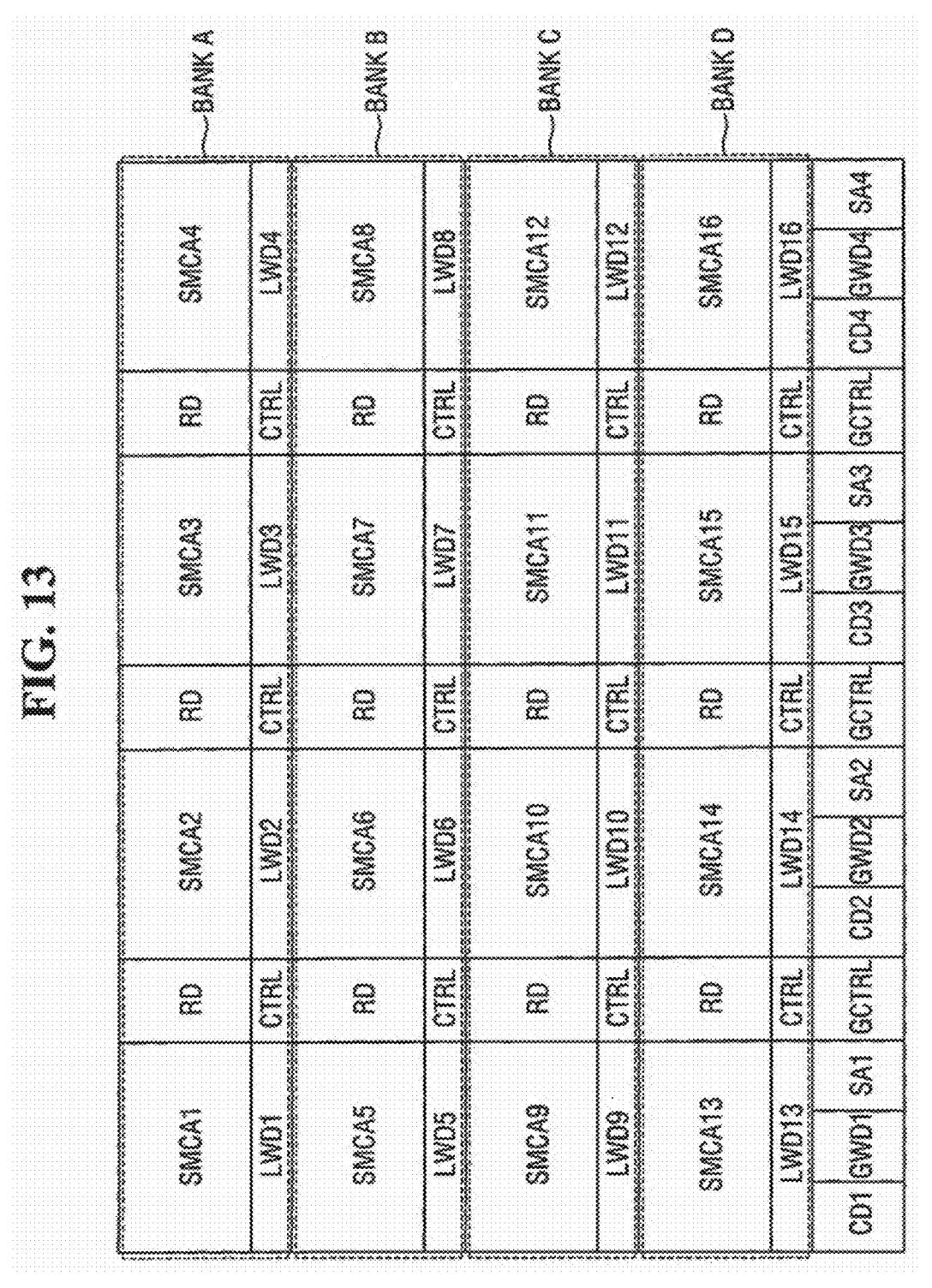
Figure 14:
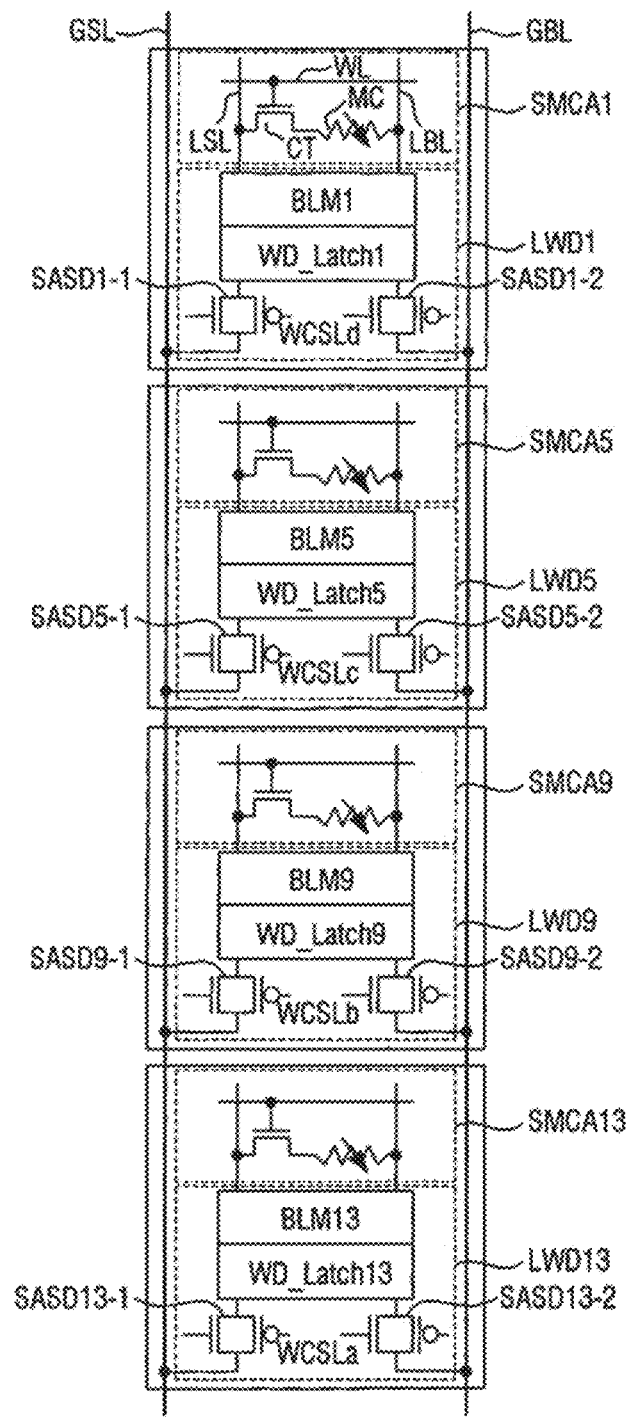
FIG. 14 is a circuit diagram of a sub-memory cell array illustrated in FIG. 13.

FIG. 13 is a conceptual layout view of a nonvolatile memory device according to some example embodiments of the present disclosure. FIG. 14 is a circuit diagram of a sub-memory cell array illustrated in FIG. 13.

Referring to FIGS. 13 and 14, a nonvolatile memory device 100 may include a plurality of sub-memory cell arrays SMCA1 through SMCA16. Row decoders RD which select wordlines WL disposed in the sub-memory cell arrays SMCA1 through SMCA16 may be disposed on first sides of the sub-memory cell arrays SMCA1 through SMCA16.

Local write drivers LWD1 through LWD16, which are for writing data to memory cells MC included in the sub-memory cell arrays SMCA1 through SMCA16, respectively, may be disposed on second sides of the sub-memory cell arrays SMCA1 through SMCA16, respectively. That is, a single write driver may be allocated to each of the sub-memory cell arrays SMCA1 through SMCA16.

Referring to FIG. 14, the local write driver WD1 may include a bitline multiplexer BLM1, a write latch WD_Latch1, and sub-memory cell array selection elements SASD1-1 and SASD1-2. A description of the local write driver WD1 may be directly applicable to the other local write drivers.

The bitline multiplexer BLM1 may select a local source line LSL and a local bitline LBL of the sub-memory cell array SMCA1 under the control of a predetermined control signal. That is, the bitline multiplexer BLM1 may select a local source line LSL and a local bitline LBL connected to a target memory cell MC to which to write data and may thus allow data to be written to the target memory cell MC. Also, the bitline multiplexer BLM1 may select a local source line LSL and a local bitline LBL connected to a target memory cell MC from which to read data and may allow data to be read from the target memory cell MC.

The write latch WD_Latch1 may perform a write operation on the memory cell MC included in the sub-memory cell array SMCA1. Specifically, the write latch WD_Latch1 may receive data to be written to the memory cell MC included in the sub-memory cell array SMCA1 from a global write driver GWD1 of FIG. 13 and may store the received data. Then, the write latch WD_Latch1 may write the stored data to the memory cell MC included in the sub-memory cell array SMCA1 in response to a predetermined control signal. In some example embodiments, the write latch WD_Latch1 may include a predetermined control block for performing a write operation on the memory cell MC included in the sub-memory cell array SMCA1.

The sub-memory cell array selection element SASD1-1 may connect a global source line GSL and the local source line LSL of the sub-memory cell array SMCA1 in response to a bank selection control signal WCSLd. The sub-memory cell array selection element SASD1-2 may connect a global bitline GBL and the local bitline LBL of the sub-memory cell array SMCA1 in response to the bank selection control signal WCSLd.

Bank selection control signals WCSLa through WCSLd may be sequentially activated. For example, the bank selection control signal WCLSd may be activated at a first point of time, the bank selection control signal WCSLc may be activated at a second point of time, which is later than the first point of time, the bank selection control signal WCLSb may be activated at a third point of time, which is later than the second point of time, and the bank selection control signal WCLSa may be activated at a fourth point of time, which is later than the third point of time. Alternatively, the bank selection control signals WCLSa through WCLSd may be activated in reverse order to that set forth herein.

Referring again to FIG. 13, local control blocks CTRL may control various operations performed on the sub-memory cell arrays SMCA1 through SMCA16. That is, the local control blocks CTRL may generate control signals for controlling the various operations performed on the sub-memory cell arrays SMCA1 through SMCA16.

Column decoders CD1 through CD4, global write drivers GWD1 through GWD4, sensing circuits SA1 through SA4, and global control blocks GCTRL may be disposed on the outside of the sub-memory cell arrays SMCA1 through SMCA16. The column decoders CD1 through CD4, the global write drivers GWD1 through GWD4, the sensing circuits SA1 through SA4, and the global control blocks GCTRL are illustrated as being disposed below the sub-memory cell arrays SMCA1 through SMCA16, but the present disclosure is not limited thereto.

The sub-memory cell arrays SMCA1 through SMCA16, which are arranged in the same row, may form memory banks BANK A through BANK D. For example, the memory bank BANK A may include four sub-memory cell arrays, i.e., the sub-memory cell arrays SMCA1 through SMCA4, the memory bank BANK B may include four sub-memory cell arrays, i.e., the sub-memory cell arrays SMCA5 through SMCA8, the memory bank BANK C may include four sub-memory cell arrays, i.e., the sub-memory cell arrays SMCA9 through SMCA12, and the memory bank BANK D may include four sub-memory cell arrays, i.e., the sub-memory cell arrays SMCA13 through SMCA16.

In response to a write command being received from the host 200 of FIG. 1, the nonvolatile memory device 100 may perform a write operation in units of the memory banks BANK A through BANK D. For example, in order to write first, second, third, and fourth data, the nonvolatile memory device 100 may write the first data to the memory cell MC included in the sub-memory cell array SMCA1 of the memory bank BANK A in a first write period, may write the second data to the memory cell MC included in the sub-memory cell array SMCA5 of the memory bank BANK B in a second write period, may write the third data to the memory cell MC included in the sub-memory cell array SMCA9 of the memory bank BANK C in a third write period, and may write the fourth data to the memory cell MC included in the sub-memory cell array SMCA13 of the memory bank BANK D in a fourth write period.

The global write driver GWD1 may control a write operation performed by the nonvolatile memory device 100. For example, the global write driver GWD1 may provide the first data to the write latch WD_Latch1 of the local write driver LWD1 and may thus allow the local write driver LWD1 to write the first data to the memory cell MC included in the sub-memory cell array SMCA1 in the first write period, may provide the second data to the write latch WD_Latch5 of the local write driver LWD5 and may thus allow the local write driver LWD5 to write the second data to the memory cell MC included in the sub-memory cell array SMCA5 in the second write period, may provide the third data to the write latch WD_Latch9 of the local write driver LWD9 and may thus allow the local write driver LWD9 to write the third data to the memory cell MC included in the sub-memory cell array SMCA9 in the third write period, and may provide the fourth data to the write latch WD_Latch13 of the local write driver LWD13 and may thus allow the local write driver LWD13 to write the second data to the memory cell MC included in the sub-memory cell array SMCA13 in the fourth write period.

The global write driver GWD1 may sequentially provide the first, second, third, and fourth data to the write latches WD_Latch1, WD_Latch5, WD_Latch9, and WD_Latch1, respectively, via the global source line GSL or the global bitline GBL. The local write drivers LWD1, LWD5, LWD9, and LWD13 may write the first, second, third, and fourth data to the memory cells MC included in the sub-memory cell arrays SMCA1, SMCA5, SMCA9, and SMCA9 via the local source lines LSL and the local bitlines LBL of the sub-memory cell arrays SMCA1, SMCA5, SMCA9, and SMCA9.

Sub-memory cell array selection elements SASD1-1, SASD5-1, SASD9-1, and SASD13-1 may connect the global source line GSL and the local source lines LSL of the sub-memory cell arrays SMCA1, SMCA5, SMCA9, and SMCA13 in response to the bank selection control signals WCLSa, WCLSb, WCLSc, and WCLSd, and sub-memory cell array selection elements SASD1-2, SASD5-2, SASD9-2, and SASD13-2 may connect the global bitline GBL and the local bitlines LBL of the sub-memory cell arrays SMCA1, SMCA5, SMCA9, and SMCA13 in response to the bank selection control signals WCLSa, WCLSb, WCLSc, and WCLSd.

The read circuit of FIG. 7 or 12 may be employed in each of the sensing circuits SA1 through SA4. In each of the global control blocks GCTRL, the common-mode feedback amplifier circuit CMF1, the first resistor element group with the first resistance RP, and the second resistor element group with the second resistance RAP of FIG. 7 may be disposed. That is, reference resistors necessary for a read operation are not disposed in the sub-memory cell arrays SMCA1 through SMCA16. Accordingly, the size of an entire memory cell array can be reduced.

In some example embodiments, the sensing circuits SA1 through SA4 may be connected to memory cells MC via, for example, the global source line GSL. For example, the transistor N4 of FIG. 9 may be connected to the memory cells MC disposed in the sub-memory cell arrays SMCA1 through SMCA16 via the global source line GSL and the local source lines LSL of FIG. 14. Accordingly, the sensing circuit SA1 can read data from the memory cells MC included in the sub-memory cell arrays SMCA1, SMCA5, SMCA9, and SMCA13, the sensing circuit SA2 can read data from the memory cells MC included in the sub-memory cell arrays SMCA2, SMCA6, SMCA10, and SMCA14, the sensing circuit SA3 can read data from the memory cells MC included in the sub-memory cell arrays SMCA3, SMCA7, SMCA11, and SMCA15, and the sensing circuit SA4 can read data from the memory cells MC included in the sub-memory cell arrays SMCA4, SMCA8, SMCA12, and SMCA16.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

While embodiments are described above, it is not intended that these embodiments describe all possible forms of the inventive concept of the present disclosure. Rather, the words used in the specification are words of description rather than limitation, and it is understood that various changes may be made without departing from the spirit and scope of the inventive concept of the present disclosure. Additionally, the features of various implementing embodiments may be combined to form further embodiments of the present disclosure.

What is claimed is:

1. A magnetic junction memory device comprising:
   a first single-transistor common-gate amplifier circuit including a first transistor which is gated by a gating voltage and has a first end connected to a first sensing node, the first single-transistor common-gate amplifier circuit configured to determine a voltage of the first sensing node by applying a first read current to a first reference resistor;
   a second single-transistor common-gate amplifier circuit including a second transistor which is gated by the gating voltage and has a first end connected to a second sensing node, the second single-transistor common-gate amplifier circuit configured to determine a voltage of the second sensing node by applying a second read current to a second reference resistor, which has a different resistance from the first reference resistor; and
   a third single-transistor common-gate amplifier circuit including a third transistor which is gated by the gating voltage and has a first end connected to a third sensing node, the third single-transistor common-gate amplifier circuit configured to determine a voltage of the third sensing node by applying a third read current to a magnetic junction memory cell.

2. The magnetic junction memory device of claim 1, further comprising:
   a common-mode feedback amplifier circuit configured to generate the gating voltage using voltages of the first and second sensing nodes and a reference voltage.

3. The magnetic junction memory device of claim 2, wherein
   the common-mode feedback amplifier circuit includes first and second input terminals,
   the first input terminal is configured to receive a difference between the voltage of the first sensing node and the voltage of the second sensing node via a voltage divider circuit, and
   the second input terminal is configured to receive the reference voltage.

4. The magnetic junction memory device of claim 1, further comprising:
   a precharge circuit configured to precharge voltages of first and second output nodes to a reference voltage; and
   a latch configured to
      develop the voltages of the first and second output nodes in accordance with the voltage of the third sensing node, and
      latch data stored in the magnetic junction memory cell based on the developed voltages of the first and second output nodes.

5. The magnetic junction memory device of claim 4, wherein
   the first output node is connected to the third sensing node.

6. The magnetic junction memory device of claim 4, wherein
   during a first period, the precharge circuit is configured to develop the voltage of the first output node in accordance with the voltage of the third sensing node and maintain the voltage of the second output node at the reference voltage, and
   during a second period, which follows the first period, the precharge circuit is configured to develop the voltages of the first and second output nodes in accordance with the voltage of the third sensing node.

7. The magnetic junction memory device of claim 1, further comprising:
a first current mirror circuit configured to make a read current flowing in the third sensing node and the third read current applied to the magnetic junction memory cell differ.

8. The magnetic junction memory device of claim 7, further comprising:
a second current mirror circuit configured to make a read current flowing in the first sensing node and the first read current applied to the first reference resistor differ.

9. The magnetic junction memory device of claim 8, further comprising:
a third current mirror circuit configured to make a read current flowing in the second sensing node and the second read current applied to the second reference resistor differ.

10. The magnetic junction memory device of claim 1, further comprising:
a memory cell array including more than one sub-memory cell array in which a plurality of magnetic junction memory cells are arranged;
a reference memory cell array outside the more than one sub-memory cell array; and
a sensing circuit including the first, second and third single-transistor common-gate amplifier circuits.

11. A magnetic junction memory device comprising:
a first single-transistor common-gate amplifier circuit including a first transistor which is gated by a gating voltage and connected to a first sensing node, the first single-transistor common-gate amplifier circuit configured to determine a voltage of the first sensing node by applying a first read current to a magnetic junction memory cell;
a gating voltage generator circuit configured to generate the gating voltage of the first transistor using a reference resistor and a reference voltage;
a precharge circuit configured to precharge voltages of first and second output nodes to the reference voltage; and
a latch configured to
develop the voltages of the first and second output nodes in accordance with the voltage of the first sensing node, and
latch data stored in the magnetic junction memory cell based on the developed voltages of the first and second output nodes.

12. The magnetic junction memory device of claim 11, wherein
during a first period, the precharge circuit is configured to develop the voltage of the first output node in accordance with the voltage of the first sensing node and maintain the voltage of the second output node at the reference voltage, and
during a second period, which follows the first period, the precharge circuit is configured to develop the voltages of the first and second output nodes in accordance with the voltage of the first sensing node.

13. The magnetic junction memory device of claim 11, wherein
the precharge circuit includes:
a second transistor connected to the first output node, and gated by a first signal;
a third transistor connected to the second output node and the second transistor, and gated by a second signal different from the first signal; and
a fourth transistor connected to the first and second output nodes, and gated by the first signal.

14. The magnetic junction memory device of claim 13, wherein
the latch includes a cross coupled latch connected to first and second output nodes.

15. The magnetic junction memory device of claim 11, wherein
the gating voltage generator circuit includes:
a second single-transistor common-gate amplifier circuit including a second transistor which is gated by the gating voltage and connected to a second sensing node, the second single-transistor common-gate amplifier circuit configured to determine a voltage of the second sensing node by applying a second read current to a first reference resistor; and
a third single-transistor common-gate amplifier circuit including a third transistor which is gated by the gating voltage and connected to a third sensing node, the third single-transistor common-gate amplifier circuit configured to determine a voltage of the third sensing node by applying a third read current to a second reference resistor, which has a different resistance from the first reference resistor.

16. The magnetic junction memory device of claim 15, wherein
the gating voltage generator circuit further includes a common-mode feedback amplifier circuit configured to generate the gating voltage using voltages of the second and third sensing nodes and the reference voltage.

17. A read method of a magnetic junction memory device including a sensing circuit which receives a gating voltage generated by using first and second reference resistors, and reads data from a magnetic junction memory cell using a reference voltage and a voltage of a sensing node that changes in accordance with a resistance of the magnetic junction memory cell, the read method comprising:
during a first period, developing a voltage of a first output node in accordance with the voltage of the sensing node and maintaining a voltage of a second output node at the reference voltage; and
during a second period, which follows the first period, developing the voltages of the first and second output nodes in accordance with the voltage of the sensing node.

18. The read method of claim 17, further comprising:
generating the gating voltage using the reference voltage and the first and second reference resistors.

19. The read method of claim 18, wherein
generating the gating voltage using the reference voltage and the first and second reference resistors includes:
generating a first sensing voltage using a first gating voltage and first reference resistor;
generating a second sensing voltage using a second gating voltage and second reference resistor;
generating a third sensing voltage using the first and second sensing voltages; and
generating the gating voltage by comparing the third sensing voltage and the reference voltage.

20. The read method of claim 17, wherein
the magnetic memory cell is in a sub-memory cell array,
the first and second reference resistors are in a reference memory cell array, and
the reference memory cell array is at an edge part of the sub-memory cell array.

* * * * *